United States Patent [19]

Sollner

[11] Patent Number: 4,745,452

[45] Date of Patent: May 17, 1988

[54] TUNNELING TRANSFER DEVICES

[75] Inventor: T. C. L. Gerhard Sollner, Winchester, Mass.

[73] Assignee: Massachusetts Institute Of Technology, Cambridge, Mass.

[21] Appl. No.: 35,222

[22] Filed: Apr. 6, 1987

Related U.S. Application Data

[63] Continuation of Ser. No. 653,455, Sep. 24, 1984, abandoned.

[51] Int. Cl.⁴ .............................................. H01L 27/14
[52] U.S. Cl. ...................................... 357/30; 357/16; 357/4; 331/94.1; 372/43
[58] Field of Search ................ 357/29, 4, 16, 17, 30 E, 357/30 R, 30 I; 372/43, 45, 46; 331/94.1

[56] References Cited

U.S. PATENT DOCUMENTS

| | | | |
|---|---|---|---|
| 3,982,207 | 9/1976 | Dingle et al. ...................... | 357/16 X |
| 4,208,667 | 6/1980 | Chang et al. ...................... | 357/16 |
| 4,348,686 | 9/1982 | Esari et al. ...................... | 357/16 X |
| 4,525,731 | 6/1985 | Chappell et al. .................. | 357/30 X |

FOREIGN PATENT DOCUMENTS

| | | | |
|---|---|---|---|
| 0091831 | 10/1983 | European Pat. Off. ......... | 357/22 A |
| 52-105785 | 5/1977 | Japan ................................ | 357/4 SL |

OTHER PUBLICATIONS

Anderson, E., *Modern Physics and Quantum Mechanics*, W. B. Saunders Co., Philadelphia, 1971, pp. 174–176.
Price, Peter J. "Physics of Heterostructures and Heterostructure Devices" IBM Research Report, 4/19/83.
"A Field-Effect Transistor with a Negative Differential Resistance" by A. Kastalsky et al., IEEE Electron Device Ltrs., vol. EDL-5, No. 2, pp. 57–60 (1984).
"Velocity-Modulation Transistor (VMT)-A New Field-Effect Transistor Concept" by H. Sakaki, Japanese Journal of Applied Physics, vol. 21, No. 6, pp. L381–L383 (1982).
"Resonant Tunneling Through Quantum Wells at Frequencies up to 2.5 THz" by T. C. L. Sollner et al., Appl. Phys. Lett. 43 (6), pp. 588–590 (1983).
"A Proposal of Single Quantum Well Transistor (SQWT)-Self-Consistent Calculations of 2D Electrons in a Quantum Well with External Voltage" by C. Hamaguchi et al., Japanese Journal of Applied Physics., vol. 23, No. 3, pp. L132–L134 (1984).

*Primary Examiner*—Andrew J. James
*Assistant Examiner*—Sara W. Crane

[57] ABSTRACT

Coupled quantum wells in which charge carriers shift from well to well by means of tunneling transfer. The quantum wells are created by disposing a material with lower carrier energy between layers of material with higher carrier energy. The spacing between wells is thin enough to allow tunneling transfer. The coupling of the wells displaces energy levels so that a system of N coupled wells has a spectrum of N energy levels. Under the proper conditions, transistions from one energy level to another result in the shift of charge carriers from one well to another. Because the tunneling transfer process is very fast, electronic devices capable of operating at terahertz frequencies are possible. Transistors, lasers, and detectors of electromagnetic radiation employing coupled quantum wells are disclosed.

18 Claims, 3 Drawing Sheets

TUNNELING TRANSFER DEVICES

The Government has rights in this invention pursuant to Contract No. F19628-80-C-0002 awarded by the Department of the Air Force.

This is a continuation of application Ser. No. 653,455, filed Sept. 24, 1984, now abandoned.

BACKGROUND OF THE INVENTION

This invention relates to semiconductor electronic apparatus and more particularly to devices which employ tunneling of charges between coupled quantum wells.

The concept of tunneling in electronic devices has been around for many years. Tunnel diodes were discovered by Esaki in 1958 (L. Esaki, Phys. Rev., 109, 603 (1958)) and since then several three terminal electronic devices have been proposed and built. The known three-terminal tunneling devices, however, all involved tunneling through only one well rather than coupled wells as disclosed herein. The transmission of carriers perpendicular to potential wells has been considered in the literature, but these devices did not employ tunneling.

One known three terminal device is described in "A Field Effect Transitor With A Negative Differential Resistance" by Kastalsky et al. in IEEE Election Devices Letters, EDL-5, 57–60 (1984). The NERFET disclosed therein is a three-terminal device in which charge is transferred out of the source-drain channel by thermionic emission rather than through the tunneling process. Although the channel of the NERFET constitutes a quantum well, the charge transfer is likely to be much slower than with tunneling.

Another three-terminal device is described in "Velocity Modulation Transistor (VMT)—A New Field Effect Transistor Concept" by Sakaki in *Japanese Journal of Applied Physics*, Vol. 21, No. 6, pp. L381–L383, (June 1982). This article discloses a device with two channels having different mobilities. However, the transport taught by Sakaki is not tunneling but rather deformation of the barrier with charge transport over the barrier. Tunneling disclosed herein offers both higher transconductance and a higher cut-off frequency of operation.

It is, therefore, an object of the present invention to provide coupled quantum wells utilizing the tunneling process for extremely high speed electronics applications.

It is a further object of the invention to provide a three-terminal device capable of operating at terahertz frequencies.

Yet another object of the invention is a detector of radiation having millimeter and submillimeter wavelengths.

A still further object of the invention is structure utilizing the tunneling process for emitting photons of electromagnetic radiation.

SUMMARY OF THE INVENTION

These and other objects of the invention are achieved in a tunneling transfer apparatus including a plurality of closely spaced abutting quantum wells coupled for tunneling transfer of charge carriers from well to well. Each of the wells has a thin inner semiconductor layer disposed between outer semiconductor layers, the carrier energy level of the inner layer being less than that of the outer layers. The carrier energy levels of each of the inner layers (and the outer layers) are adjustable so that the ground state energy of charge carriers may vary from well to well. In one form of the invention, the mobility of charge carriers may also be different for the wells.

In one preferred embodiment of the invention, the tunneling process is utilized in a three-terminal device such as a transistor. Two coupled wells, each with different mobilities, connect a source and drain. A gate electrode is arranged to produce an electric field across the coupled quantum wells to cause transitions between two energy levels with a concomitant shifting of charge carriers from the higher to the lower mobility well, or vice versa, thereby altering the conductance between the source and drain.

In yet another preferred embodiment of the invention, a pair of coupled quantum wells of differing mobility is utilized as a detector of electromagnetic radiation. In this case, an electromagnetic wave with suitable photon energy propagating in the plane of the wells will induce transitions between the energy levels in response to the radiation. The transitions will cause a change in the source-drain current.

In yet another preferred embodiment of the invention, a two-well coupled structure emits photons. Such a two-well structure can emit coherent radiation if the two-well coupled structure were located in a laser cavity. A three-well laser is also disclosed.

BRIEF DESCRIPTION OF THE DRAWING

The invention disclosed herein will be understood better with reference to the drawing of which.

DESCRIPTION OF THE PREFERRED EMBODIMENTS

The novel structures disclosed herein involve tunneling of charged carriers between thin layers (wells) which, except for the tunneling transfer, confine the carriers. Confinement takes place because the ground state energy of carriers is higher in the surrounding material. These quantum wells must be thin enough, for example, less than 200 Å, so that the carrier ground state energy is raised by the confinement above the energy which a carrier would have if it were free to move in all three dimensions. Furthermore, the quantum wells are coupled through thin regions or barriers of larger bandgap material, sufficiently thin (again, less than 200 Å) and with a barrier sufficiently low so that the carriers can tunnel through these barriers. The coupling of a plurality of quantum wells displaces the energy levels so that a system of N coupled wells has a spectrum of N energy levels. Transitions between these energy levels are accomplished by electric fields across the wells produced either by electrodes or electromagnetic waves. If the wells are at different potential energies, the transitions between energy levels result in the shifting of charge carriers from one well to another at the extremely high speeds afforded by the quantum tunneling process.

Figure 1:
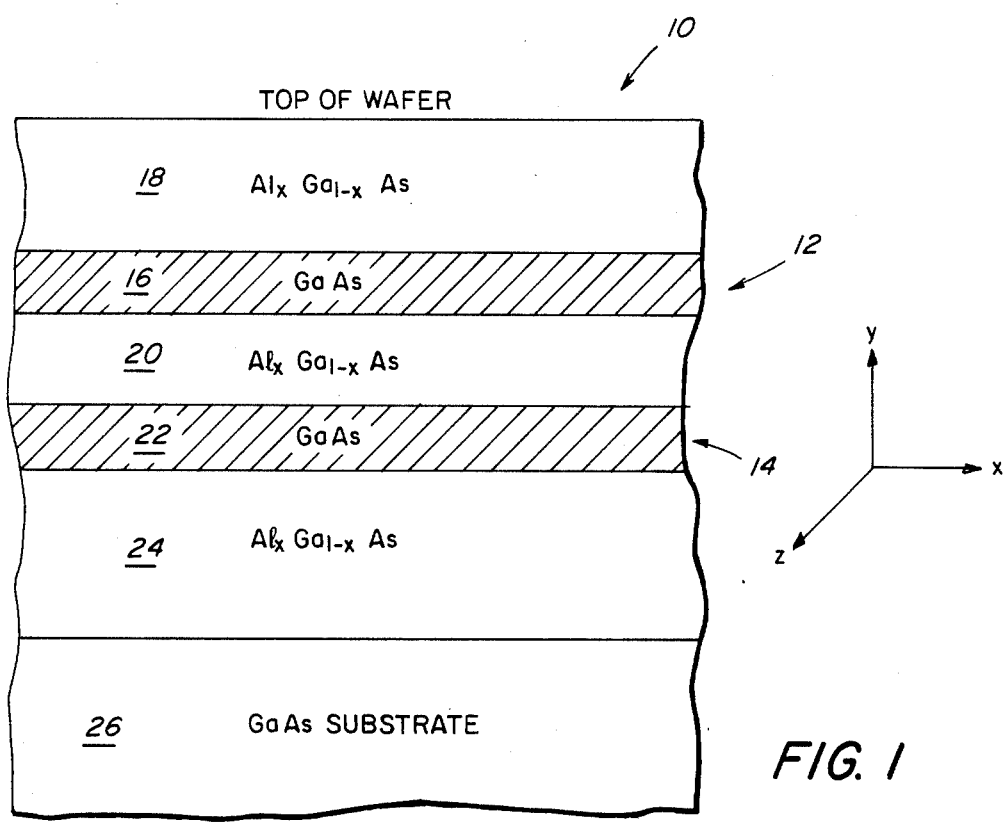
FIG. 1 is a schematic illustration of the coupled quantum wells disclosed herein.

In FIG. 1, a structure 10 includes two quantum wells 12 and 14. The quantum well 12 is created by disposing a thin layer of gallium arsenide 16 between layers of aluminum gallium arsenide, $Al_xGa_{1-x}As$, 18 and 20. A suitable material for the layers 18 and 20 is $Al_{0.3}Ga_{0.7}As$, that is, gallium arsenide in which aluminum ions replace some of the gallium ions in the lattice. Similarly, the quantum well 14 is created by disposing a layer 22 of gallium arsenide between the layer 20 and another layer 24 of $Al_xGa_{1-x}As$. These layers are disposed on a gallium arsenide substrate layer 26. It should be noted that the layers 16 and 22, while substantially gallium arsenide, may contain small amounts of aluminum ions (but less than in the layers 18 and 20) to alter the carrier energy levels in the two wells 12 and 14. The structure shown in FIG. 1 can be realized using either molecular beam epitaxy or metalorganic chemical vapor deposition. The aluminum gallium arsenide layer 20 serves as a potential barrier separating the quantum wells 12 and 14 because the bandgap and hence the carrier energy level of the aluminum gallium arsenide is higher than that of the gallium arsenide layers 16 and 22.

Figure 2A:
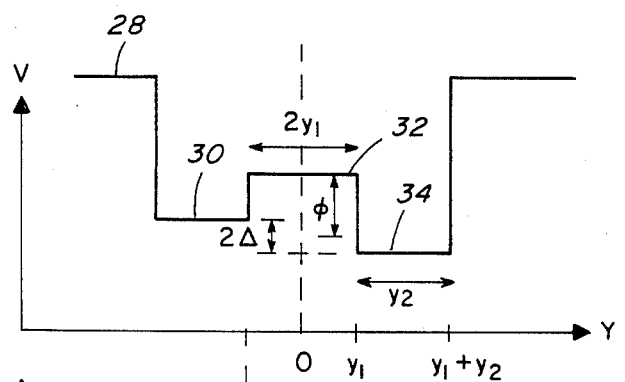
FIG. 2a is a graph of charge carrier potential energy versus distance through the wells and barriers which separate them.
Figure 2B:
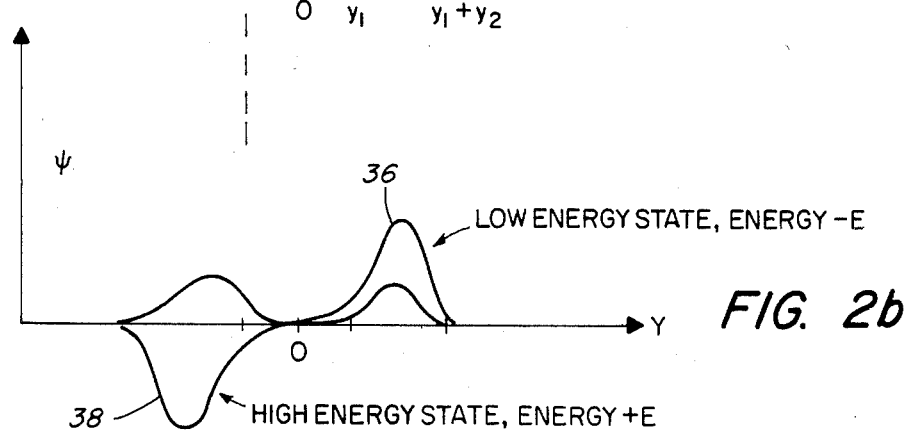
FIG. 2b is a graph of charge carrier wave function versus distance through the wells and the barriers which separate them.

FIGS. 2a and 2b illustrate the concept of coupled quantum wells disclosed herein. FIG. 2a is a graph of carrier potential energy, V, versus distance through the wells and barrier. The Y axis in FIG. 2a corresponds to the Y axis in FIG. 1. The segment of the graph in FIG. 2a labeled 28 corresponds to the carrier potential energy in the layer 24 of FIG. 1. The segment 30 corresponds to the potential energy within the layer 22, the segment 32 corresponds to the carrier potential energy in the layer 20 and the segment 34 corresponds to the carrier potential energy in the layer 16. The height of the barrier represented by the segment 32 is continuously variable by changing x in the $Al_xGa_{1-x}As$, and is within the range of 0–0.4 eV. Carriers are confined to the regions with less aluminum, here shown as pure gallium arsenide. Charge carriers can be supplied by impurity atoms placed in one or more of the wells, or placed in the barrier or outer regions of the higher bandgap material. For some applications, large scattering in a well is desirable so impurities can be placed within the well layers. For low scattering, impurities can be placed in the outer $Al_xGa_{1-x}As$ regions.

FIG. 2b is a graph of the carrier wave functions, $\psi$, again versus distance through the wells and barrier. Because the thickness of the layer 20 forming the barrier between the quantum wells 12 and 14 ($2y_1$ of FIG. 2a) is less than about 200 Å, the carriers can tunnel through the barriers so that quantum wells 12 and 14 are coupled. Note that in FIG. 2a the carrier potentials represented by the segments 30 and 34 differ by an amount $2\Delta$. The fact that the carrier potential energy differs between the regions 30 and 34 results in a spatial localization of the charges in the different energy levels. FIG. 2b shows that the carrier wave function splits into a low energy state of energy $-E$ represented by a curve 36 and a high energy state of energy $+E$ represented by a curve 38. Those skilled in the art will recognize that the square of the carrier wave function $\psi$ is related to the probability of finding a charge carrier at a particular location. It is important to note that in the low energy state represented by the curve 36, the peak in $\psi$ occurs in the region 34 having the lower carrier ground state energy so that in the low energy state, more charge carriers will reside in the well region 34 to the right of the barrier in FIG. 2a. On the other hand, in the high energy state, the wave function $\psi$ has a peak in the region 30. Thus, by causing transitions from one energy state to another, charge carrier populations are shifted from one quantum well to the other via the tunneling process resulting from the quantum mechanical nature of the charge carriers as described by the wave function $\psi$. Because this tunneling process is exceedingly fast, high speed switching is possible.

FIGS. 1, 2a and 2b show a two-well structure which has two energy levels separated by energy 2E where $$E = (\Delta_o^2 + \Delta^2)^{\frac{1}{2}}$$

$$\Delta_o = \left(\frac{2\pi^2\hbar^2}{\bar{\mu}my_2}\right)e^{-2\bar{\mu}y_1}$$

$$\bar{\mu} = 2\left(\frac{2m\phi}{\hbar^2}\right)^{\frac{1}{2}}$$

Figure 3:
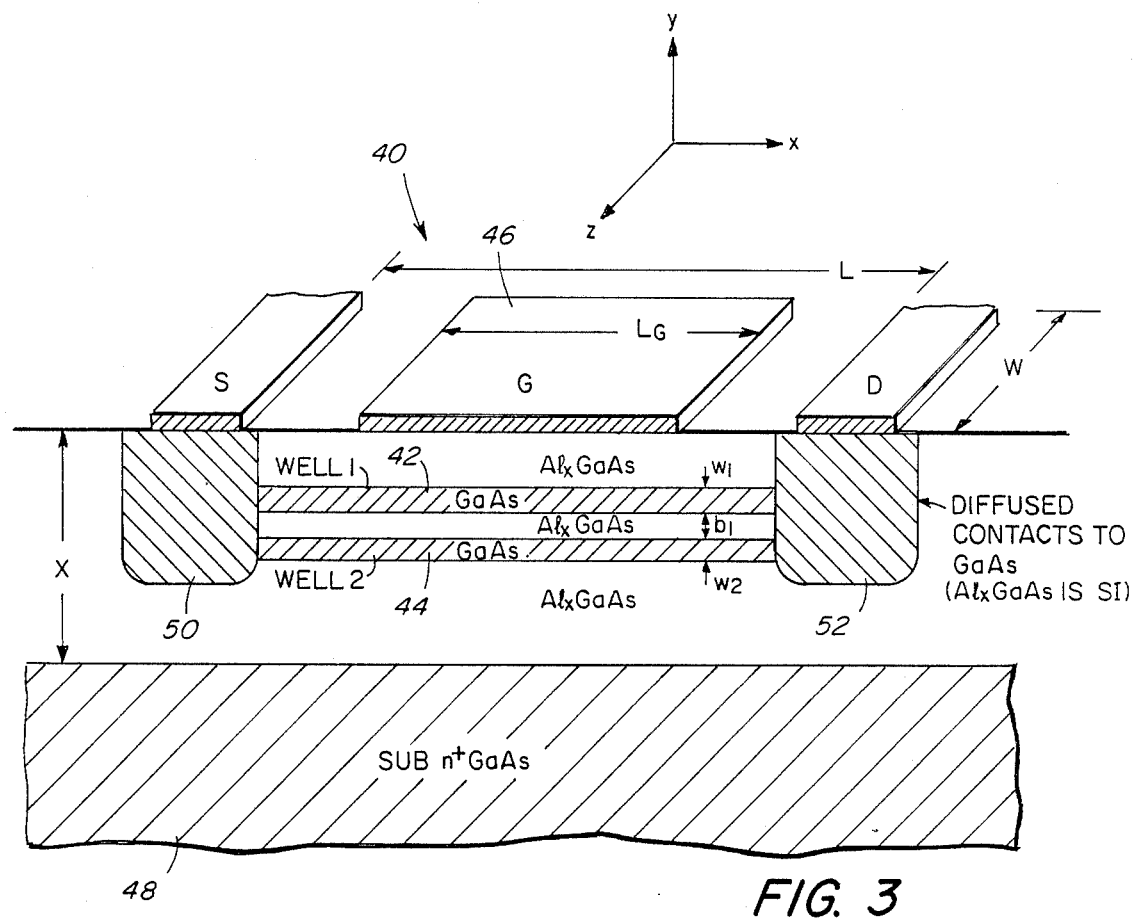
FIG. 3 is a schematic perspective view of a coupled two-well transistor.

See, A. B. Pippard, *The Physics of Vibration*, Vol. 2, pt. 2, Ch. 18, Cambridge University Press, 1983. Here $\hbar$ is Planck's constant (h) divided by $2\pi$ and m is the mass of a charge carrier. The other terms are defined in FIG. 2a: $y_1$ is the half-width of the barrier region 32, $\phi$ is the average carrier energy of the barrier 32 above the wells 30 and 34, $2\Delta$ is the potential energy difference of carriers between well 30 and well 34, and $y_2$ is the width of well 34 (it is assumed for simplicity that well 30 has the same width). DC electric fields, which change $\Delta$, can be used to tune the energy level splitting and AC fields can shift the relative populations of the energy levels. A non-zero $\Delta$ can thus be produced with electric fields or by having different (and small) amounts of aluminum ions in the substantially GaAs layers 16 and 22. An important device which utilizes the energy levels of coupled quantum wells is a tunneling transfer transistor. Such a tunneling transfer transistor 40 is shown in FIG. 3. The tunneling transfer transistor 40 uses a two-well structure substantially as shown in FIG. 1. Electric fields are applied across wells 42 and 44 by means of a gate electrode 46 and a substrate electrode 48. Another electric field is applied in the plane of the wells by means of source and drain contacts 50 and 52 respectively. The source 50 and drain 52 electrodes are diffused or implanted contacts to the gallium arsenide.

In order that the structure in FIG. 3 operate as a transistor, the charge carrier mobility of one well is less than that in the other well, so that the source-drain current depends on the relative occupation of charge carriers in the two wells. The relative populations of charge carriers are altered by gate-substrate voltages which cause an energy transition in the coupled quantum wells 42 and 44 as discussed above. Those skilled in the art will recognize that relative charge carrier mobility can be altered by doping the gallium arsenide layers with appropriate impurities. Almost any impurity will act as a scattering center, but Si, Ge, S, Sn, Te and Se are commonly used to supply electrons as charge carriers in GaAs, while C, Be, Mg, Zn, Cd, Mn and Ag are used to supply holes. For example, if the well 42 has lower carrier mobility than the well 44, then the path between source and drain will have high resistance if a large fraction of the charge carriers are located in the well 42. On the other hand, when the charge carriers reside in the well 44 having higher charge carrier mobility, then there will be a more conductive path between the source and drain. Thus, electric fields applied across the tunneling transfer transistor 40 by means of the gate 46 and the substrate 48 cause energy transitions which result in a shift in the relative population of charge carriers in the wells 42 and 44. Because of the different mobilities in the two wells, this shift in carrier population results in changes in the conductance between source and drain.

The difference in population of charge carriers in the two wells is measured by the net polarization $P(\omega)$. The polarization is related to the applied electric field $\xi(\omega)$ by the susceptibility $\chi(\omega)$, $P(\omega)=\chi(\omega)\xi(\omega)$. If $P_0$ is defined as the dipole moment with all the charge centered in well 44, then the fraction of charge which is switched into well 44 by $\xi(\omega)$ is $R=P(\omega)/P_0$.

The susceptibility $\chi$ can be calculated by considering the response of the charges in the two wells to an instantaneously applied step in field $\xi$ across the wells. The details of the calculation are set forth by A. B. Pippard in *The Physics of Vibration*, Vol. 2, part 2, chapter 18 (Cambridge University Press 1983). The exact form of $\chi$ depends somewhat on the relaxation times involved, but for most of the frequency region up to a frequency of $2E/\hbar$ the susceptibility can be considered frequency independent and equal to $$\chi = \frac{p_0^2 \Delta_0^2}{E^3}$$

The conductance between the source 50 and the drain 52 is given by the sum of the conductances of the two wells. If one well has a much higher mobility than the other, the high mobility term dominates even when small charge densities occupy the higher mobility well. The total conductance is then $$g \approx g_1 = \left(\frac{e\mu_1 W}{L}\right)\sigma_1$$

where $\sigma_1$ is the charge density per unit area in well 44, $\mu_1$ is the mobility and L and W are the geometric quantities defined in FIG. 3. If $\sigma$ is the total charge density in both wells then $$\sigma_1 = \sigma \frac{p(\omega)}{p_0}$$

and $$g = \left(\frac{e\mu_1 W}{L}\right) \frac{\sigma \chi(\omega)\xi(\omega)}{p_0}$$

Here $\xi$ is a field applied by the gate 46 and is given by $$\xi(\omega) = \frac{V_G(\omega)}{X}$$

For a transistor such as the tunneling transfer transistor 40 of FIG. 3, the maximum operating frequency is given by the rate at which the input capacitance $C_{in}$ is charged by the transconductance $g_m$, $$f_m = \frac{g_m}{2\pi C_{in}}$$

It is assumed that $C_{in}$ is the total gate-to-substrate capacitance. From FIG. 3, $$C_{in} = \frac{\epsilon L W}{X}$$

The transconductance is defined as $$g_m = \frac{dI_{DS}}{dV_G} \approx V_{DS} \frac{dg}{dV_G}$$

where we have assumed $V_{DS}$ is constant for simplicity. Then $$g_m = \left(\frac{V_{DS} e\mu_1 W \sigma}{XL}\right) \frac{\chi(\omega)}{p_0}$$

so that finally $$f_m = \frac{V_{DS}}{L} \left(\frac{e\mu_1 \sigma}{2\pi \epsilon L}\right) \frac{\chi(\omega)}{p_0}$$

Using the expression for the susceptibility given above and for

| | |
|---|---|
| $E = \sqrt{3}\ \Delta_0$ | $\mu_1 = 10^5$ cm$^2$/Vs |
| $\Delta_0 = 10$ meV | $V_{DS}/L = 10^3$ V/cm |
| $T = 77$K | $\sigma = 5 \times 10^{12}$ cm$^{-2}$ |
| $y_1 + y_2/2 = 50$Å | $L = 1\ \mu$m |
| $y_1 = 15$Å | $\phi = 0.23$ eV | we get $$f_m > 10^{12} s^{-1}$$

Note that the frequency $f_m$ is greater than 1 THz (1000 GHz). The above parameters are quite easily within reach of present standard fabrication techniques such as described by Sollner et al., in "Resonant Tunneling Through Quantum Wells at Frequencies up to 2.5 THz", *Applied Physics Letters* 43(6), pp. 588–590 (1983). This value of $f_m$ is high enough to make useful devices into the submillimeter wavelength region, a region which has no three terminal devices with gain at present.

One reason that the tunneling transfer transistor 40 is so fast is that such devices are not limited by transit times from source to drain as in the case of conventionally known field effect transistors. For the devices disclosed herein, the limiting transit time is the tunneling time between wells rather than transit time from source to drain in known devices. Frequencies in excess of 1 THz can be fabricated by using thinner or lower barriers.

Figure 4:
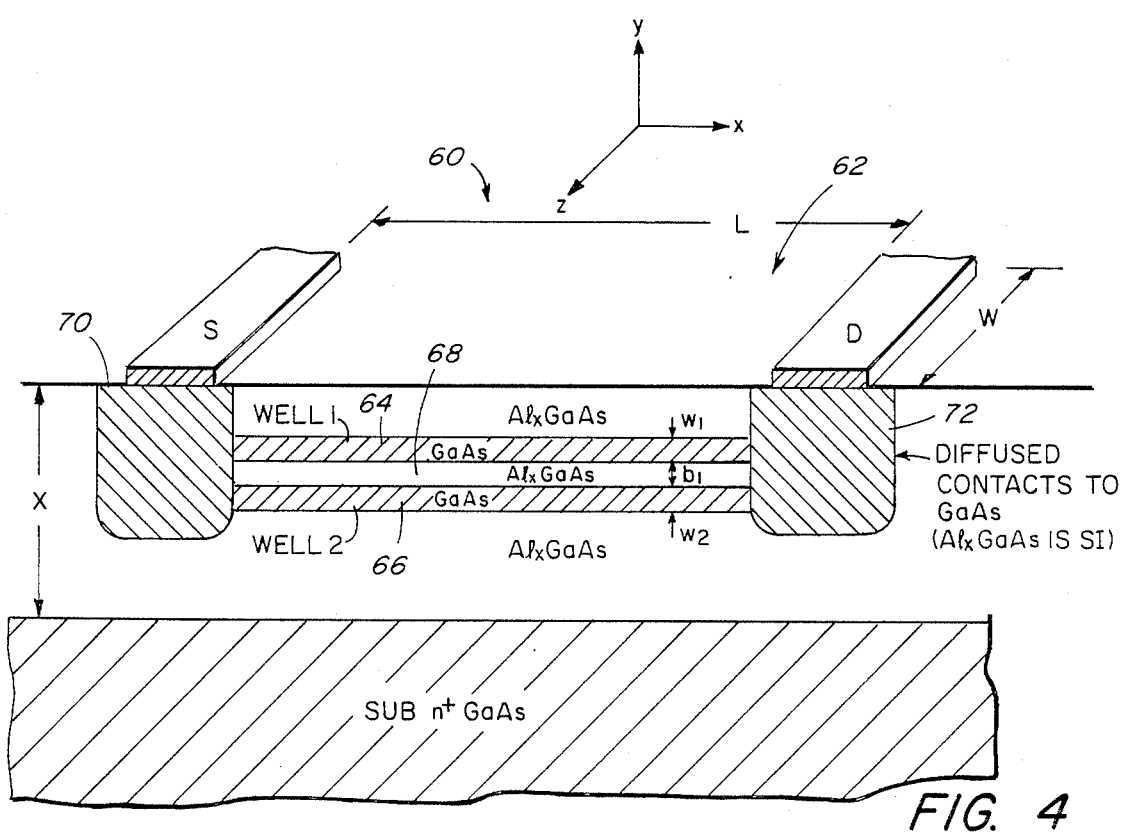
FIG. 4 is a schematic perspective illustration of a radiation detector.

Another embodiment of this invention is a detector of electromagnetic radiation. Such a detector is shown in FIG. 4. An electromagnetic radiation detector 60 has a structure similar to that shown in FIG. 3 without the need for a gate electrode. A photon of electromagnetic radiation traveling along a path 62 in the plane of wells 64 and 66 separated by a barrier 68 will induce transitions between energy levels if the photon energy is equal to the level splitting 2E discussed above. The energy level transition produces a larger population in the upper energy state such as the well 64. If $\Delta$ (defined in FIG. 2a) is not zero, then the transition causes a net transfer of charge from the lower energy well to the higher energy well and this net transfer is detected by a change in current between a source 70 and a drain 72 because of different charge carrier mobilities in the two wells. Using the susceptibility calculated earlier, the absorption coefficient $\gamma$, defined by the fact that the fields decay as exp $(-\gamma/2z)$ is $$\gamma = \frac{2e^2\sigma(y_1 + y_2/2)^2}{n\epsilon_0 w_1 hc}$$

Here n is the refractive index of the semiconductor, and the other terms are as defined hereinbefore. Using parameter values similar to those used to calculate $f_m$ above, and assuming unity filling factor, $$\gamma > 10^4 \text{cm}^{-1}$$

This is a very large absorption coefficient, enabling the fabrication of small, high speed detectors and mixers with near unity quantum efficiency. The addition of a transparent gate as in FIG. 3 would allow the application of a DC electric field across the wells, thereby changing 2E and tuning the photon energy to which the detector is most sensitive. With current materials and technology, the frequencies best suited for the radiation detector 60 are in the range of 0.1–5 THz, a region of the spectrum particularly lacking in sensitive, fast detectors.

Figure 5:
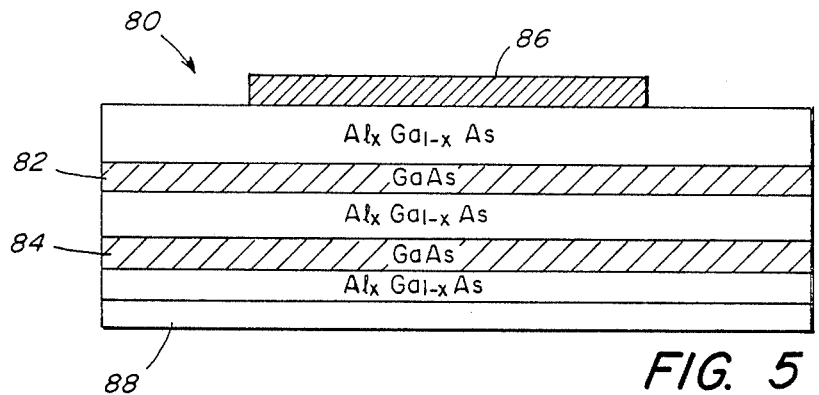
FIG. 5 is a two-well, coupled device for emitting photons.

In yet another important embodiment of the invention, the coupled quantum wells employing tunneling as disclosed herein is capable of emitting photons. Furthermore, coherent radiation can be obtained if the coupled quantum well device is placed in a suitable laser cavity. In FIG. 5, a two-well structure 80 includes two coupled quantum wells, 82 and 84. Electric fields are applied perpendicular to the plane of the wells by a gate 86 and a substrate electrode 88. Since only two levels are involved, the device 80 must operate in a pulsed mode with some time between pulses for converting the populations. An electric field applied perpendicular to the plane of the wells will establish most of the carriers in the lower energy well, and then this field is quickly reversed. Now the lower state has fewer carriers than the upper state (inversion), and a photon of the right energy will stimulate a transition to emit a photon which, of course, is the laser principle. Another pulse of photons will be obtained each time the field is reversed. The amplitude of the applied field as well as the laser cavity length will determine the lasing frequency, but the best frequency will be in the range of 0.1–5 THz using present materials and technology.

Figure 5A:
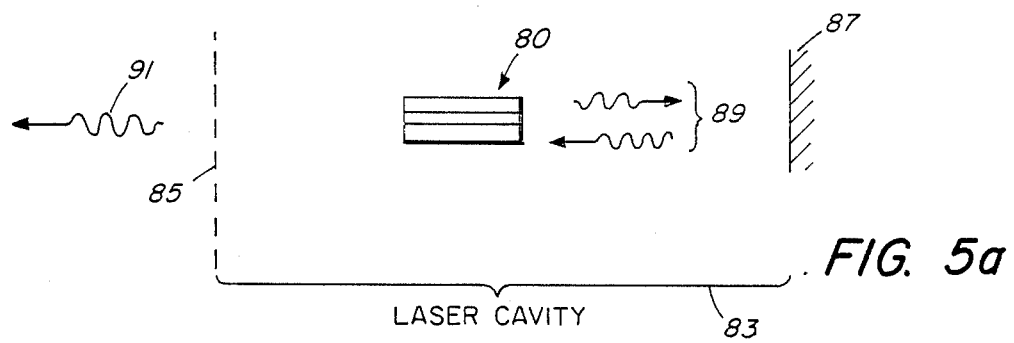
FIG. 5a is a schematic representation of a laser cavity including the two-well device of FIG. 5.

FIG. 5a shows the two-well structure 80 of FIG. 5 located in a laser cavity 83 created by a partially reflecting mirror 85 and a mirror 87. Photons 89 within the laser cavity 83 interact with the two-well active element 80 producing a stimulated emission to emit an output photon 91.

Figure 6:
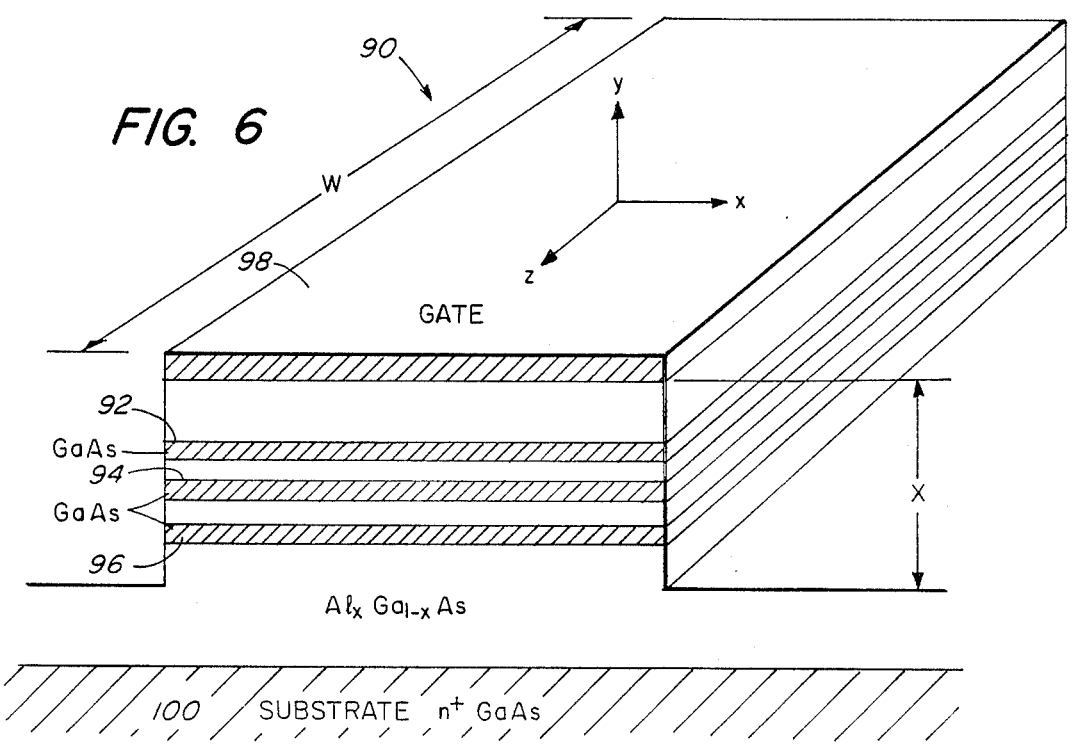
FIG. 6 is a schematic illustration in perspective of a coupled three well device.

FIG. 6 shows a three-well structure 90 including three wells 92, 94 and 96. Because of the three coupled quantum wells, the energy spectrum will have three levels with $E_1 < E_2 < E_3$. The well coupling is such that $E_2 - E_1$ is not equal to $E_3 - E_2$. Energy transitions are accomplished by means of electric fields applied across the three-well structure by means of a gate 98 and a substrate electrode 100. Pumping the transition $E_1 \rightarrow E_3$ will result in a population inversion of either $E_3$ over $E_2$ or $E_2$ over $E_1$, depending on the relaxation times. The oscillating electric fields which cause transitions can either be supplied by gate-to-substrate voltages or by electromagnetic fields propagating in the plane of the wells with the electric field polarized in the y-direction, as in the photoconductor and pulsed laser discussed above. For example, the pump could be supplied by propagating waves and the lower frequency laser output could appear on the microstrip transmission line defined by the gate 98 and substrate 100. The structure 90 can also be used as an amplifier rather than an oscillator. In such a case, an isolator must be incorporated to reduce the reverse gain and prevent oscillation.

It is thus seen that the objects of this invention have been achieved in that there has been disclosed coupled quantum wells which utilized tunneling transfer to shift populations of charge carriers. The coupling of two or more quantum wells causes shifts in energy levels. Thus, a system of N coupled quantum wells will have a spectrum of N energy levels. Transitions between energy levels cause charge carriers to shift from well to well when the energy of the wells is different. If charge carrier mobilities differ in the wells, an extremely fast transistor is possible. As discussed above, the coupled well structure can also be used as a detector of electromagnetic radiation and as an emitter of electromagnetic radiation.

It is recognized that modifications and variations of the above-disclosed invention will occur to those skilled in the art. It is intended that all such modifications and variations be included within the scope of the appended claims.

What is claimed is:

1. A detector of electromagnetic radiation comprising:
    a pair of closely spaced, coupled semiconductor structures each structure having a thin inner layer disposed between outer layers, the ground state carrier energy levels at zero bias in said inner layers being less than that in the outer layers and different from one another, two adjacent ones of said outer layers comprising a higher-carrier-energy layer, the higher-carrier-energy layer between the two lower-carrier-energy layers being very thin to provide splitting of the conduction-band energy subbands in the coupled layers, wherein carrier mobility is higher in one of said inner layers than in the other; and
    source and drain electrodes, but no gate electrode, in electrical contact with said coupled structures;
    whereby electromagnetic waves propagating in the plane of the layers alters conductance between the source and drain for detection of the electromagnetic waves.

2. The detector of claim 1 wherein the thickness of the higher-carrier-energy layer is less than 200 A.

3. The detector of claim 1 wherein the thickness of said inner layers is less than 200 Å.

4. The detector of claim 1 wherein the inner layers are gallium arsenide.

5. The detector of claim 1 wherein the outer layers are $Al_xGa_{1-x}As$.

6. The detector of claim 1 wherein said outer layers are $Al_{0.3}Ga_{0.7}As$.

7. A laser comprising:
   a pair of closely spaced, coupled semiconductor structures each structure having a thin inner layer disposed between outer layers, the ground state carrier energy levels at zero bias of said inner layers being less than in the outer layers, two adjacent ones of said outer layers comprising a higher-carrier-energy layer, higher-carrier-energy layer between the two inner low-carrier-energy layers being very thin to provide splitting of the conduction-band energy subbands in the two coupled into layers;
   a gate electrode for generating electric fields across said two semiconductor structures to shift charge carriers by the tunneling process from one inner layer to the other and for adjusting the energy levels of the conduction-band energy subbands;
   means for alternating said electric fields to create population inversion; and
   means to stimulate a transition between the energy levels of the conduction-band energy subbands to emit photons.

8. The laser of claim 7 wherein the thickness of the higher-carrier-energy layer is less than 200 A.

9. The laser of claim 7 wherein the thickness of said inner layers is less than 200 Å.

10. The laser of claim 7 wherein the inner layers are gallium arsenide.

11. The laser of claim 7 wherein the outer layers are $Al_xGa_{1-x}As$.

12. The laser of claim 7 wherein the outer layers are $Al_{0.3}Ga_{0.7}As$.

13. A laser comprising three closely spaced coupled semiconductor structures each structure having a thin inner layer disposed between outer layers, the ground state carrier energy levels at zero bias in said inner layers being less than that in the outer layers, two adjacent ones of said outer layers comprising higher-carrier-energy layers and the two higher-carrier-energy layers between the three lower-carrier-energy layers being very thin to provide splitting of the energy levels in the coupled layers and having three energy states which are subbands within the conduction band of energy $E_1$, $E_2$ and $E_3$ wherein $E_2 - E_1$ is not equal to $E_3 - E_2$;
   means for generating oscillating electric fields across said three semiconductor structures to shift charge carriers by the tunneling process among the structures to created population inversion; and
   means for stimulating a transition between two of the three energy states $E_1$, $E_2$, $E_3$ to emit photons.

14. The laser of claim 13 wherein the thickness of the higher-carrier-energy layers is less than 200 A.

15. The laser of claim 13 wherein the thickness of said inner layers is less than 200 Å.

16. The laser of claim 13 wherein said inner layers are gallium arsenide.

17. The laser of claim 13 wherein the outer layers are $Al_xGa_{1-x}As$.

18. The laser of claim 13 wherein the outer layers are $Al_{0.3}Ga_{0.7}As$.

* * * * *